United States Patent
Tong et al.

(10) Patent No.: US 6,989,326 B2
(45) Date of Patent: Jan. 24, 2006

(54) BUMP MANUFACTURING METHOD (75) Inventors: Ho-Ming Tong, Taipei (TW);
Chun-Chi Lee, Kaohsiung (TW);
Jen-Kuang Fang, Pingtung (TW);
Min-Lung Huang, Kaohsiung (TW);
Jau-Shoung Chen, Hsinchu Hsien (TW); Ching-Huei Su, Kaohsiung (TW); Chao-Fu Weng, Tainan (TW); Yung-Chi Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/248,197

(22) Filed: Dec. 26, 2002

(65) Prior Publication Data

US 2003/0157792 A1 Aug. 21, 2003

(30) Foreign Application Priority Data

Feb. 21, 2002 (TW) .................................... 91102993 A (51) Int. Cl.
*H01L 21/44* (2006.01)

(52) U.S. Cl. .................. 438/614; 438/109; 438/612; 438/613

(58) Field of Classification Search ............ 438/109, 438/612, 613, 614
See application file for complete search history.

(56) References Cited

U.S. PATENT DOCUMENTS

| 5,162,257 | A | * | 11/1992 | Yung ............................ 437/183 |
| 5,462,638 | A | * | 10/1995 | Datta et al. ............... 156/656.1 |
| 5,486,282 | A | | 1/1996 | Datta et al. .................. 205/123 |
| 5,508,229 | A | * | 4/1996 | Baker .......................... 437/183 |
| 5,937,320 | A | * | 8/1999 | Andricacos et al. ......... 438/614 |
| 6,222,279 | B1 | * | 4/2001 | Mis et al. .................... 257/779 |
| 6,417,089 | B1 | * | 7/2002 | Kim et al. ................... 438/612 |
| 6,586,322 | B1 | * | 7/2003 | Chiu et al. .................. 438/612 |
| 2002/0173134 | A1 | * | 11/2002 | Viswanadam et al. ...... 438/613 |

* cited by examiner

*Primary Examiner*—Amir Zarabian
*Assistant Examiner*—Pamela E Perkins
(74) *Attorney, Agent, or Firm*—Jianq Chyun IP Office (57) ABSTRACT A method of forming bumps on the active surface of a silicon wafer. A first under-bump metallic layer is formed over the active surface of the wafer. A second under-bump metallic layer is formed over the first under-bump metallic layer. A portion of the second under-bump metallic layer is removed to expose the first under-bump metallic layer. A plurality of solder bumps is implanted onto the second under-bump metallic layer. The exposed first under-bump metallic layer is removed so that only the first under-bump metallic layer underneath the second under-bump metallic layer remains.

24 Claims, 7 Drawing Sheets

BUMP MANUFACTURING METHOD

CROSS REFERENCE TO RELATED APPLICATIONS

This application claims the priority benefit of Taiwan application serial no. 91102993, filed Feb. 21, 2002.

BACKGROUND OF INVENTION

1. Field of Invention

The present invention relates to a method of manufacturing bumps. More particularly, the present invention relates to a process of fabricating bumps having a shorter contact period with etchant so that volume reduction of the bumps is minimized.

2. Description of Related Art

In this information explosion age, electronic products are used almost everywhere. Computer and processing stations driven by powerful integrated circuits are employed in offices, educational institutions, recreational industries, business and commercial companies. As electronic technology continues to progress, products having more powerful functions and more attuned to personal needs are developed. Furthermore, most electronic products are increasingly light and compact thanks to the efficient fabrication of many types of high-density semiconductor packages. A major innovation is the flip chip design capable of cramming of a considerable number of integrated circuits together. In a flip-chip design, a plurality of bumps is formed on the bonding pads of a silicon chip. Each bump directly contacts a corresponding contact point on a substrate so that the chip and the substrate are electrically connected. Compared with the conventional wire-bonding and tape automated bonding (TAB) method of joining a chip with a substrate, the flip-chip design has a shorter overall conductive path and hence a better electrical connectivity. In addition, the backside of the chip may be exposed to facilitate heat dissipation during operation. Due to the distinguishing advantages of flip-chip packages, semiconductor manufacturing favors its production.

Figure 1:
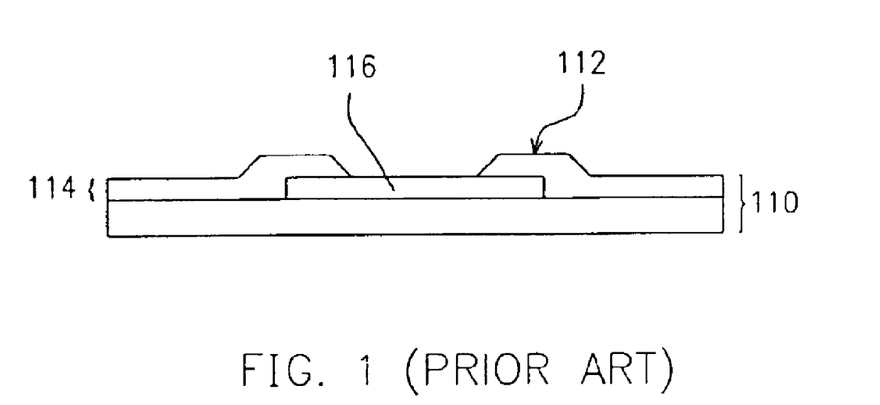
FIGS. 1 to 7 are partially magnified cross-sectional views of structures on the surface of a silicon wafer showing the progression of steps for producing bumps on the wafer according to a conventional method.

FIGS. 1 to 7 are partially magnified cross-sectional views of structures on the surface of a silicon wafer showing the progression of steps for producing bumps on the wafer according to a conventional method. As shown in FIG. 1, a silicon wafer 110 is provided. The wafer 110 has an active surface 112. The wafer 110 further includes a passivation layer 114 and a plurality of bonding pads 116 (only one of them is shown) on the active surface 112 of the wafer 110. The passivation layer 114 exposes the bonding pad 116.

Figure 2:
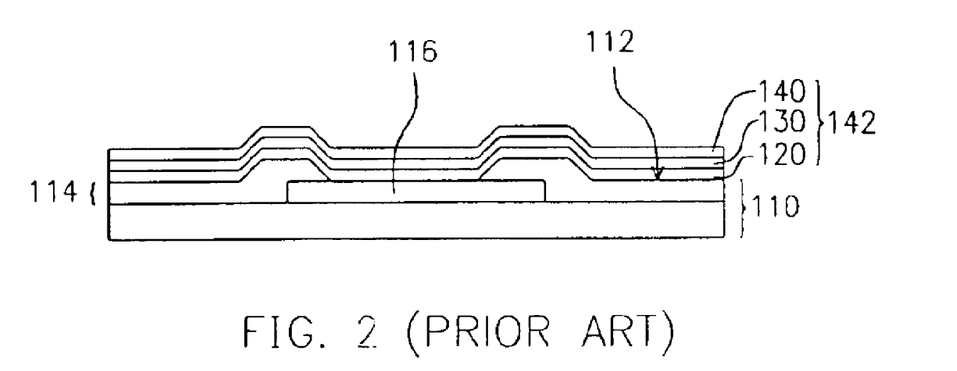

As shown in FIG. 2, an adhesion layer 120 is formed over the active surface 112 of the wafer 110 by conducting a sputtering operation. The adhesion layer 120 covers the bonding pad 116 and the passivation layer 114. Thereafter, a barrier layer 130 is formed over the adhesion layer 120 by conducting a sputtering or an electroplating operation. A wettable layer 140 is formed over the barrier layer 130 by conducting a sputtering or an electroplating operation. Here, the fabrication of a so-called under-bump metallic layer 142 is complete. The under-bump metallic layer 142 actually is a composite layer comprising the adhesion layer 120, the barrier layer 130 and the wettable layer 140.

Figure 3:
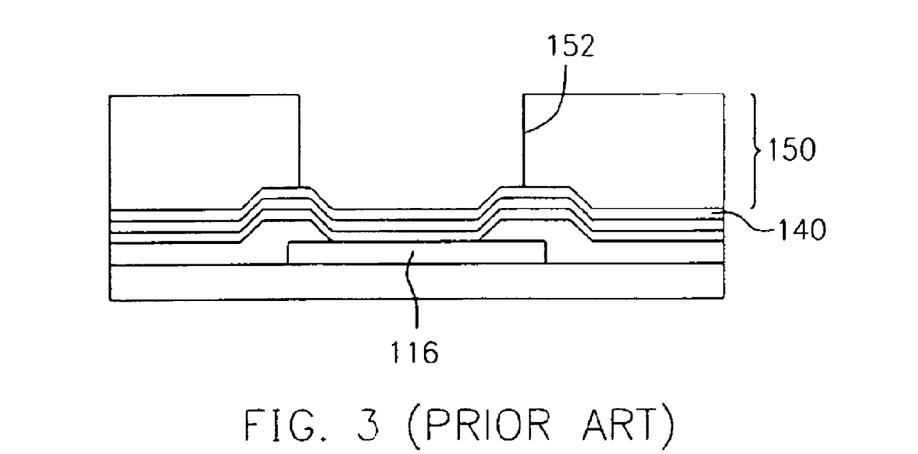

As shown in FIG. 3, a photolithographic operation is conducted by forming a photoresist layer 150 over the wettable layer 140, exposing the photoresist layer 150 to light and then developing the photoresist layer. Ultimately, a pattern (not shown) is transferred to the photoresist layer 150. The photoresist layer 150 now contains a plurality of openings 152 (only one is shown) that expose the wettable layer 140 above the bonding pad 116.

Figure 4:
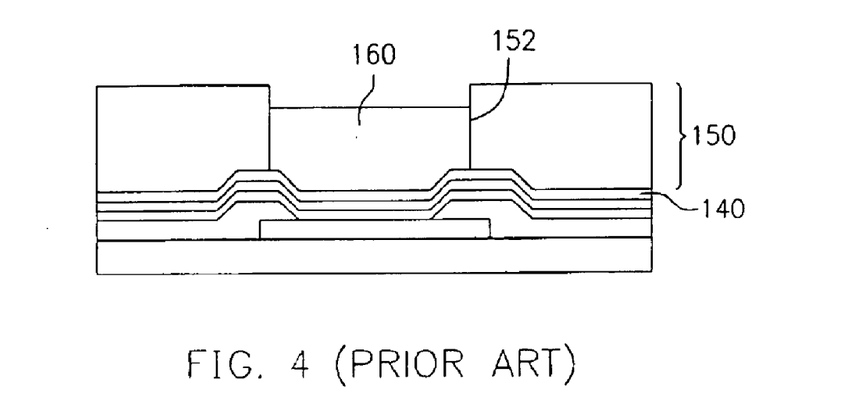

As shown in FIG. 4, metal is deposited to refill the opening by conducting an electroplating operation so that a plurality of solder bumps 160 (only one is shown) is formed inside the opening 152 of the photoresist layer 150. The solder bump 160 completely covers the exposed wettable layer 140.

Figure 5:
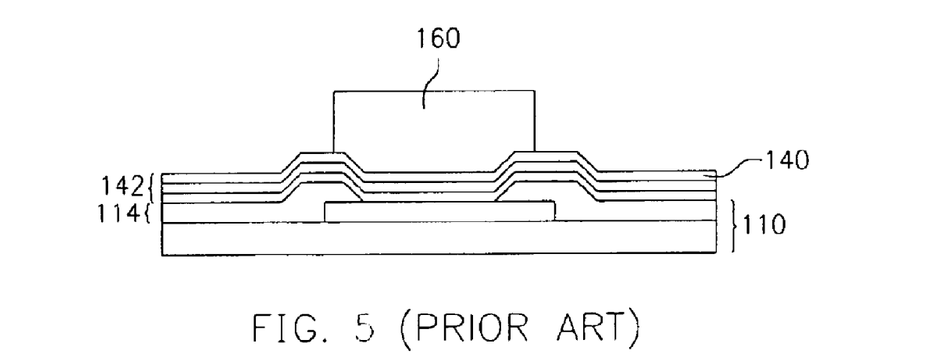

As shown in FIGS. 4 and 5, the photoresist layer 150 is completely removed from the top of the wettable layer 140.

Figure 6:
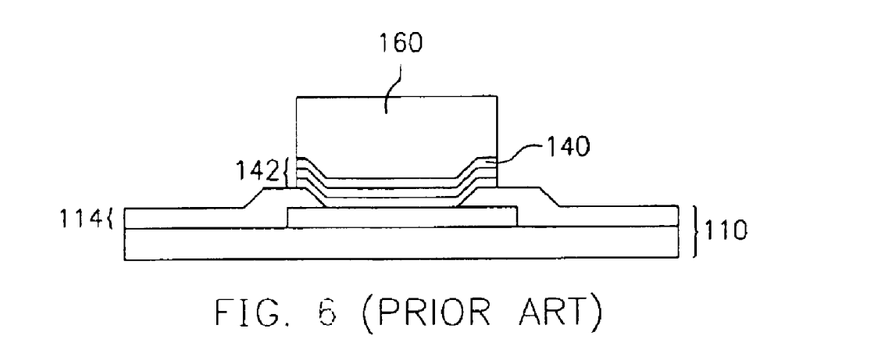

As shown in FIGS. 5 and 6, the under-bump metallic layer 142 outside the solder bump 160 region is removed by etching. Consequently, only the residual under-bump metallic layer 142 remains underneath the solder bump 160. The passivation layer 114 above the wafer 110 is now exposed.

Figure 7:
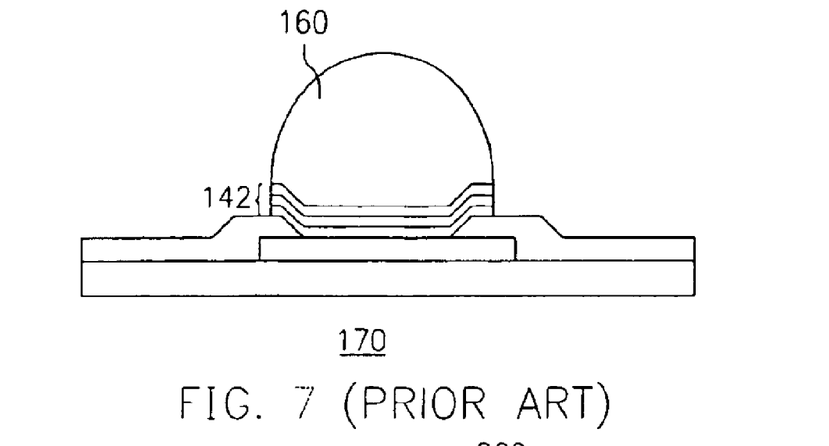

As shown in FIG. 7, a reflow operation is conducted by sprinkling flux over the wafer 100 and heating to a temperature such that the solder bump 160 starts to melt and turns into a hemispherical shape bump 170. The bump 170 is actually a composite structure that includes the under-bump metallic layer 142 and the solder bump 160.

In the fabrication process as shown in FIGS. 1 to 7, etchant is used to remove the wettable layer 140, the barrier layer 130 and the adhesion layer 120 in sequence (not shown), that is, the under-bump metallic layer 142. During the etching of wettable layer 140, the barrier layer 130 or the adhesion layer 120, the etchant may come in contact with the solder bump 160 and etch away a portion of the solder bump 160 layer. Hence, overall thickness of the solder bump 160 may be reduced leading to material wastage and difficulty in controlling solder bump 160 quality.

Figure 8:
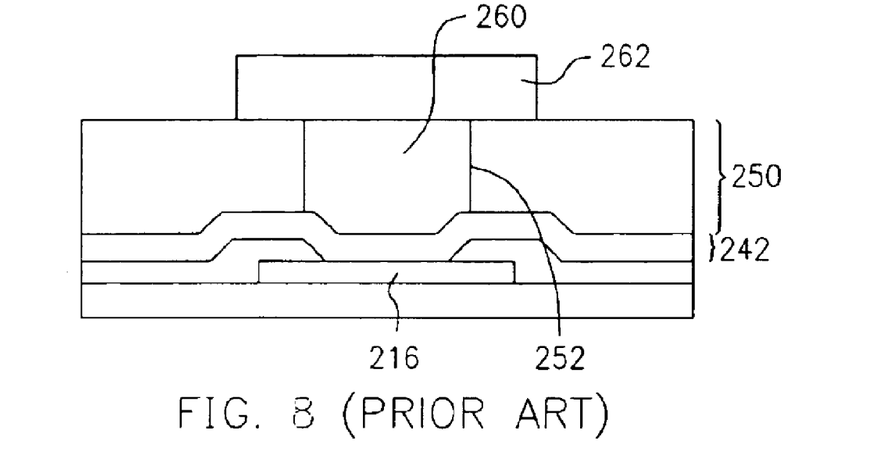
FIGS. 8 and 9 are schematic cross-sectional views of bumps on a silicon wafer fabricated according to another conventional method.
Figure 9:
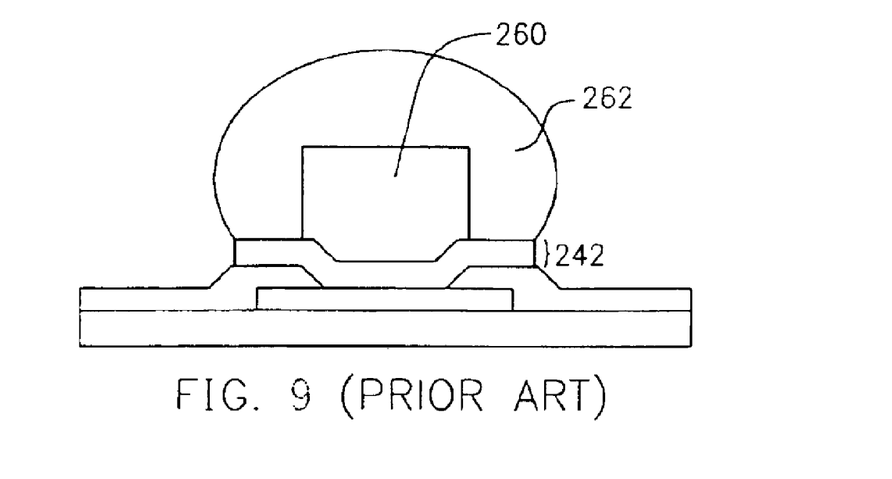

FIGS. 8 and 9 are schematic cross-sectional views of bumps on a silicon wafer fabricated according to another conventional method. As shown in FIG. 8, a photoresist layer 250 is formed over an under-bump metallic layer 242 after a photolithographic process. The photoresist layer 250 has a plurality of openings 252 (only one is shown) that exposes the under-bump metallic layer 242 above a bonding pad 216. An electroplating operation is conducted to fill the openings 252 and form a first solder bump 260. The solder bump is made from copper, for example. A second electroplating operation is carried out to form a second solder bump 262 over the first solder bump 260. The second solder bump 262 extends over the photoresist layer 250. The second solder bump 262 is made from lead-tin alloy, for example. The photoresist layer 250 is removed as shown in FIG. 9. Thereafter, a reflow operation is conducted by sprinkling flux over the wafer and heating the wafer to melt the second solder bump 262 partially and enclose the first solder bump 260. In addition, the second solder bump 262 runs down over the under-bump metallic layer 242 and forms a blob of material having a hemispherical structure. Finally, the exposed under-bump metallic layer 242 is removed so that only the under-bump metallic layer 242 underneath the first solder bump 260 and the second solder bump 262 remains. However, during the etching of the under-bump metallic layer 242, etchant (not shown) will contact the second solder bump 262. Hence, a portion of the second solder bump 262 is removed and volume of the second solder bump 262 is reduced leading to material wasting and difficulty in controlling the ultimate dimension of the second solder bump 262.

SUMMARY OF INVENTION

Accordingly, one object of the present invention is to provide a process of fabricating bumps capable of reducing contact period of solder bumps with etchant and minimizing volume reduction of the solder bumps. Ultimately, dimension of the solder bumps is more precisely controlled.

A second object of this invention is to provide a process of fabricating bumps such that the peeling of solder bumps due to etchant is prevented.

Note in the following description that the use of the preposition "over" as in "a second layer is formed over a first layer" means that the second layer is either in contact with the first layer or simply above the first layer.

To achieve these and other advantages and in accordance with the purpose of the invention, as embodied and broadly described herein, the invention provides a process of fabricating bumps on a silicon wafer. The wafer has an active surface with a passivation layer and a plurality of bonding pads thereon. The passivation layer exposes the bonding pads. First, an adhesion layer is formed over the active surface of the wafer. The adhesion layer covers the bonding pads and the passivation layer. A barrier layer is formed over the adhesion layer and then a wettable layer is formed over the barrier layer. A first photolithographic process is carried out to form a plurality of photoresist blocks over the wettable layer. Thereafter, a first etching operation is conducted to remove the wettable layer and the barrier layer outside the photoresist covered region so that only the wettable layer and the barrier layer underneath the photoresist blocks remain. The photoresist blocks are removed. A second photolithographic process is carried out to form a photoresist layer over the adhesion layer. The photoresist layer has a plurality of openings that expose the wettable layer. A metal-filling operation is conducted to form solder bumps inside the openings in the photoresist layer The photoresist layer is removed A second etching operation is conducted to remove the exposed adhesion layer so that only the adhesion layer underneath the barrier layer remains while the passivation layer covering the wafer is exposed. A second etching operation is conducted. Finally, a reflow operation is carried out to turn the solder bumps into blobs of material having a hemispherical profile.

According to one preferred embodiment of this invention, the adhesion layer can be a layer of titanium, titanium-tungsten alloy, aluminum or chromium, the barrier layer can be a layer of nickel-vanadium alloy and the wettable layer can be a layer of copper, palladium or gold.

In brief, a two-stage process is used to etch the under-bump metallic layer in this invention. The first stage includes etching the wettable layer and the barrier layer. Since the solder bumps are not yet formed over the wettable layer, etchant will not attack the solder bumps. Etchant will contact the solder bump only when the adhesion layer is etched in the second etching operation. Hence, the bump fabrication process is able to minimize volume reduction of the solder bumps due to etchant contact. Consequently, the solder bumps can have a more precise dimension.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Reference will now be made in detail to the present preferred embodiments of the invention, examples of which are illustrated in the accompanying drawings. Wherever possible, the same reference numbers are used in the drawings and the description to refer to the same or like parts.

Figure 10:
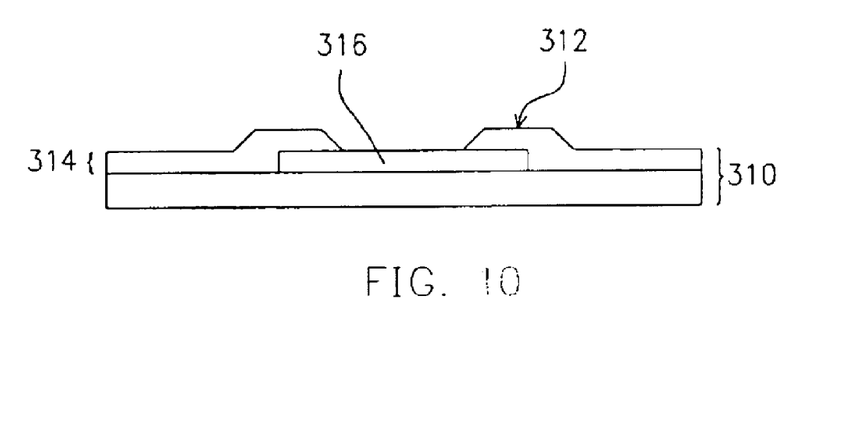
FIGS. 10 to 20 are partially magnified cross-sectional views of structures on the surface of a silicon wafer showing the progression of steps for forming bumps over a silicon wafer according to one preferred embodiment of this invention.

FIGS. 10 to 20 are partially magnified cross-sectional views of structures on the surface of a silicon wafer showing the progression of steps for forming bumps over a silicon wafer according to a first preferred embodiment of this invention. As shown in FIG. 10, a silicon wafer 310 is provided. The wafer 310 has an active surface 312 with a passivation layer 314 and a plurality of bonding pads 316 (only one is shown) thereon. The passivation layer 314 exposes the bonding pads 316.

Figure 11:
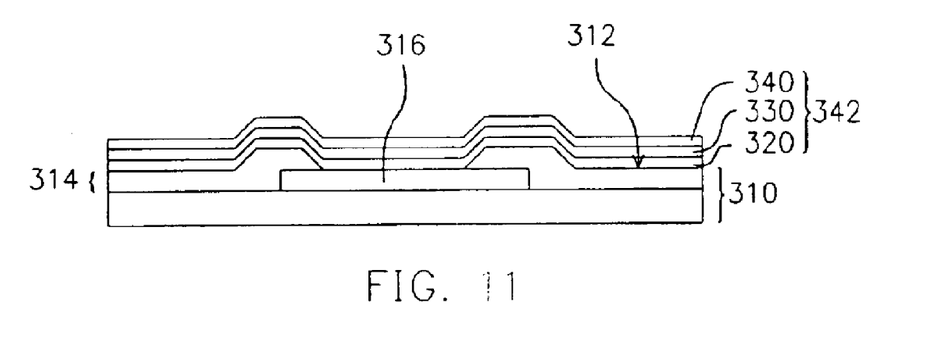

As shown in FIG. 11, an adhesion layer 320 is formed over the active surface 312 of the wafer 310 by sputtering or evaporation plating. The adhesion layer 320 covers both the bonding pads 316 and the passivation layer 314. The adhesion layer 320 can be made from a material including, for example, titanium, titanium-tungsten alloy, aluminum or chromium. A barrier layer 330 is formed over the adhesion layer 320 by sputtering, electroplating or evaporation plating. The barrier layer 330 having a thickness between 2000 Å to 4000 Å can be made from a material such as nickel-vanadium alloy, for example. A wettable layer 340 is formed over the barrier layer 330 by sputtering, electroplating or evaporation plating. The wettable layer 340 can be made from a material including, for example, copper, palladium or gold. Hence, a so-called under-bump metallic layer 342 that comprises the adhesion layer 320, the barrier layer 330 and the wettable layer 340 is thereby formed.

Figure 12:
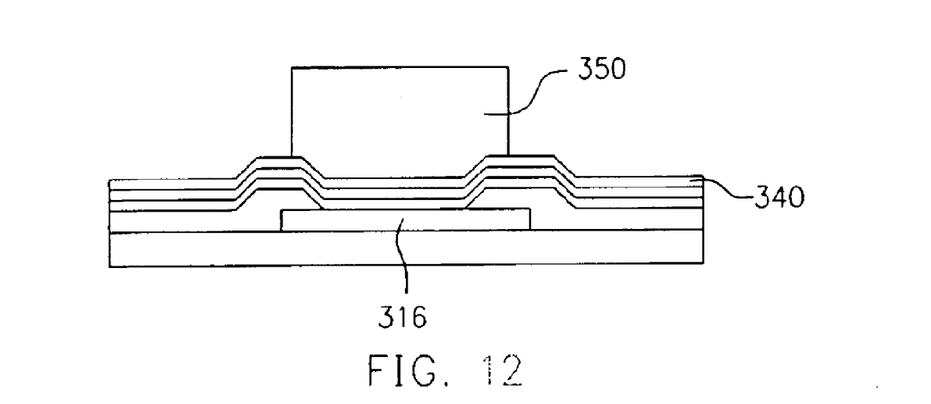

As shown in FIG. 12, a first photolithographic process is carried out by forming a photoresist layer over the wettable layer 340, exposing the photoresist layer through a mask and developing the photoresist layer chemically. Ultimately, a pattern (not shown) is transferred from the mask to the photoresist layer. In other words, a plurality of photoresist blocks 350 (only one is shown) is formed in the locations for forming the bumps directly above the bonding pads 316.

Figure 13:
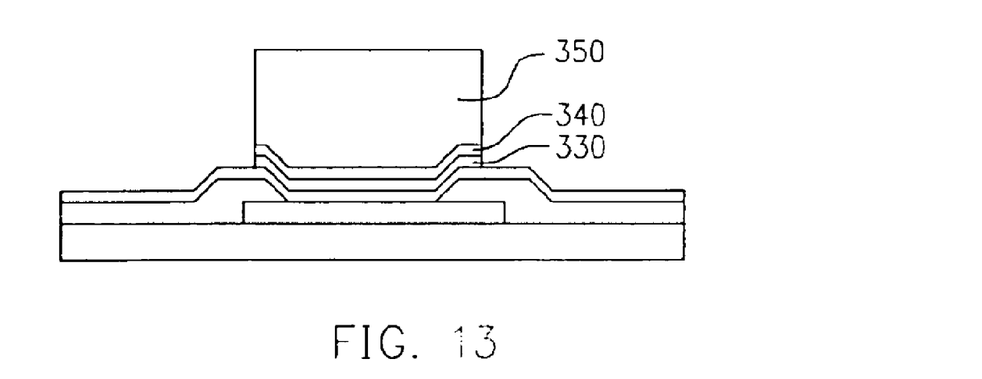

As shown in FIG. 13, a first etching operation is conducted to remove the wettable layer 340 and the barrier layer 330 outside the photoresist blocks 350 so that residual wettable layer and barrier layer remain underneath the photoresist blocks 350. In the step, a portion of the wettable layer and the barrier layer is removed. The copper wettable layer 340 is etched using an etchant containing ammonium hydroxide and hydrogen peroxide having a composition according to U.S. Pat. No. 6,222,279, or an etchant containing potassium sulfate ($K_2SO_4$) and gycerol according to U.S. Pat. No. 5,486,282 and 5,937,320 or some other known chemical etchants. The nickel-vanadium barrier layer 330 is etched using sulfuric acid ($H_2SO_4$) as the etchant. Actual etching operation differs according to the actual working environment and is briefly described in the following.

In a first embodiment, the barrier layer 330 is etched at room temperature using 1%~98% sulfuric acid ($H_2SO_4$) for a period exceeding 2 hours.

In a second embodiment, the barrier layer 330 is etched at a temperature above 80° C. using 1%~98% sulfuric acid ($H_2SO_4$) for a period exceeding 2 hours.

In a third embodiment, the barrier layer 330 is etched in an electrochemical etching operation. For example, a current density of about 0.001~0.02A/$cm^2$, preferably 0.0025A/$cm^2$, is passed while the etching is conducted at room temperature using 10% sulfuric acid ($H_2SO_4$) for a period between 20 seconds to 110 seconds. However, the optimal etching period is between 20 seconds to 40 seconds. In addition, either a constant current or a pulse current may be applied during etching.

Furthermore, the nickel-vanadium barrier layer 330 may be etched using a diluted phosphoric acid solution having a composition according to U.S. Pat. No. 5,508,229.

Figure 14:
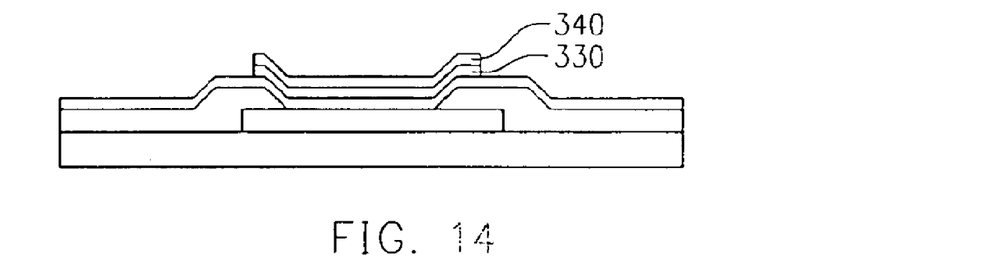

As shown in FIG. 14, the photoresist blocks 350 are removed.

Figure 15:
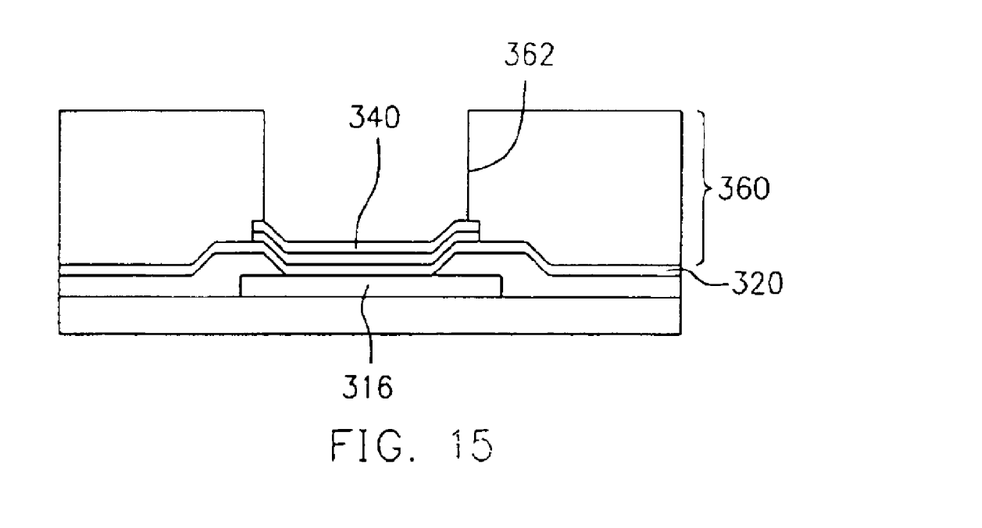

As shown in FIG. 15, a second photolithographic process is carried out to form a photoresist layer 360 over the adhesion layer 320 and the wettable layer 340. Through photo-exposure and photoresist development, a pattern (not shown) is transferred from a mask to the photoresist layer 360. The photoresist layer 360 has a plurality of openings 362 (only one is shown) that expose the residual wettable layer 340 on the bonding pads 316.

Figure 16:
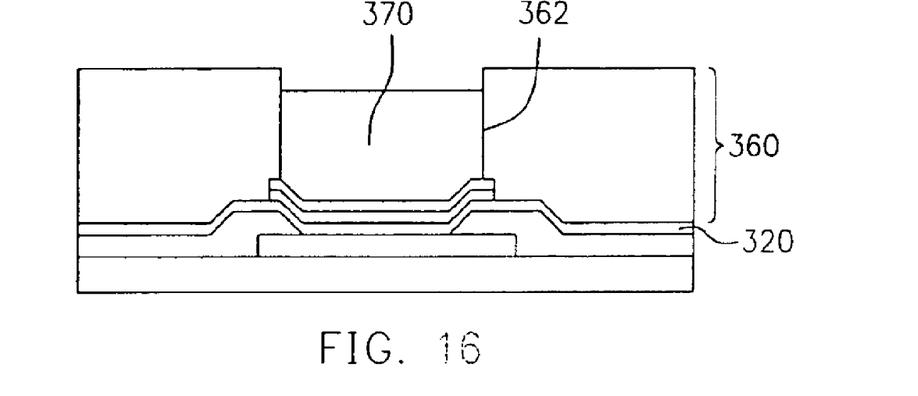
Figure 17:
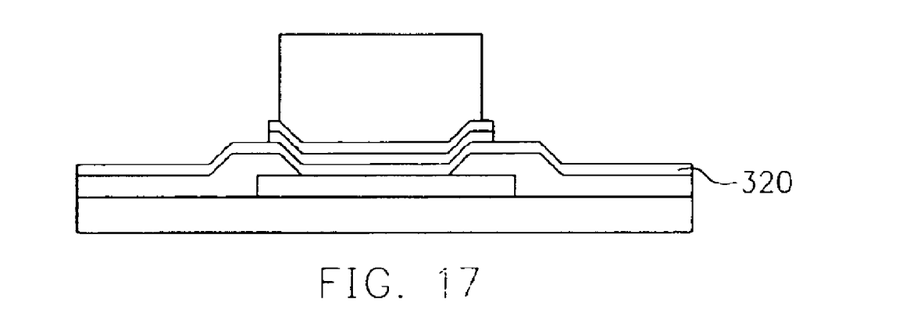

As shown in FIG. 16, metallic material is deposited into the openings 362 in the photoresist layer 360 by electro-plating to form a plurality of solder bumps 370 (only one is shown). Thereafter, the photoresist layer 360 is removed from the upper surface of the adhesion layer 320 to form a structure shown in FIG. 17.

Figure 18:
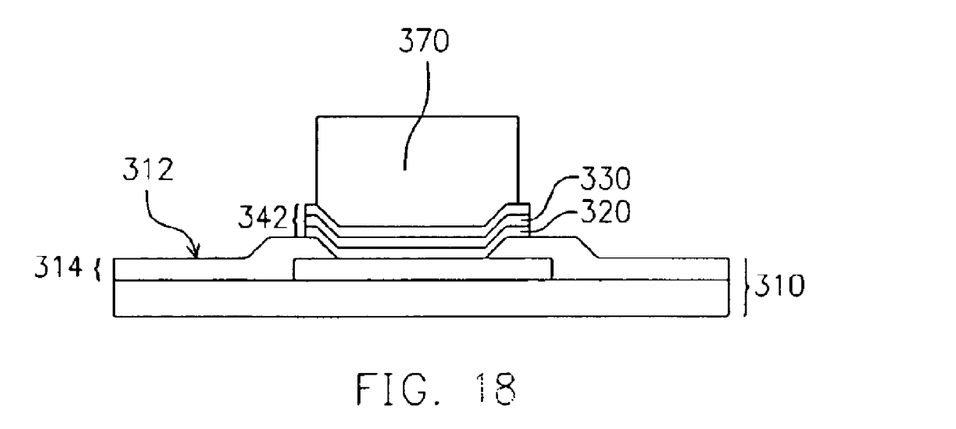

As shown in FIG. 18, a second etching operation is conducted to remove the exposed adhesion layer 320 so that only the adhesion layer 320 underneath the barrier layer 330 remains while the passivation layer 314 on the wafer 310 is exposed. If the adhesion layer 320 is a titanium-tungsten alloy layer, etchant containing hydrogen peroxide ($H_2O_2$), ethylene diamine tetraacetic (EDTA) and potassium sulfate ($K_2SO_4$) and having a composition according to U.S. Pat. No. 5,462,638 can be used so that the etching effect on the solder bumps 360 is minimal. If the adhesion layer is a chromium layer, an etchant containing hydrochloric acid (HCl) having a composition according to U.S. Pat. No. 5,162,257 can be used so that the etching effect on the solder bumps 360 is also minimal. If the adhesion layer is a titanium layer, an etchant containing ammonium hydroxide and hydrogen peroxide ($H_2O_2$) having a composition according to U.S. Pat. No. 5,162,257 can be used so that the etching effect on the solder bumps 360 is also minimal. Alternatively, hydrogen fluoride (HF) can be used as an etchant for etching the titanium adhesion layer 320. If the adhesion layer is an aluminum layer, an etchant containing phosphoric acid and acetic acid having a composition according to U.S. Pat. No. 5,508,229 can be used.

Figure 19:
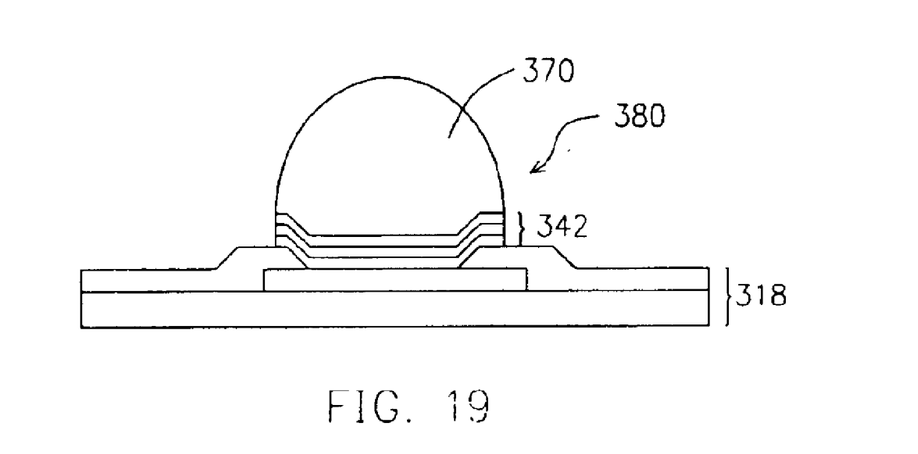
Figure 20:
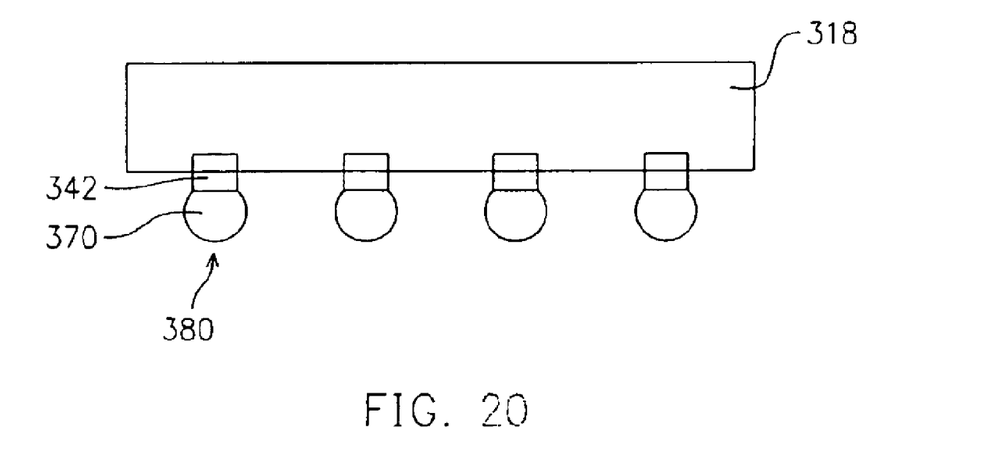

As shown in FIG. 19, a reflow operation is carried. Flux material is sprinkled onto the wafer and the wafer is heated until the solder bumps 370 partially melt. Through the heating, the solder bumps 370 are transformed into a blob of material having a hemispherical profile. This finishes the Fabrication of the bumps 380. Note that each bump is a composite structure comprising an under-bump metallic layer 342 and a solder bump 370. The wafer 310 is finally sliced into a plurality of chips as shown in FIG. 20.

In the aforementioned process, the wafer 310 may be sliced into chips immediately after the second etching operation. The reflow operation is an optional step that can be added on demand. If no reflow operation is conducted, the cross-sectional area of the under-bump metallic layer 342 will be greater than the solder bump 370 and the contact area with the under-bump metallic layer 342 but smaller than the active surface 3212 of the wafer as shown in FIG. 18.

In the fabrication process with reference to FIGS. 10 to 20, a two-stage etching process is used to etch the under-bump metallic layer 342. During the first etching operation, that is, the etching of the wettable layer 340 and the barrier layer 330, etchant will not etch the solder bumps 370 because the solder bumps 370 are yet to be formed over the wettable layer 340. Etchant will contact the solder bumps 370 only when the adhesion layer 320 is etched in the second etching operation. Consequently, the period of contact of solder bumps 370 with etchant is reduced and hence dimensional reduction of the solder bumps 370 is minimized. Moreover, peeling of the solder bumps due to contact with etchant during fabrication is also prevented.

Material constituting the under-bump metallic layer is also not limited to the aforementioned. Various other types of under-ball metallic materials may similarly be applied to the fabrication of bumps.

In addition, the solder bumps can be made from a material such as gold, tin-lead alloy or lead-free metal while the bonding pads can be made from a material such as aluminum or copper.

The under-bump metallic layer according to this invention need not be limited to just three layers (the adhesion layer, the barrier layer and the wettable layer). Other numbers of conductive layers is possible. For example, the under-bump metallic layer can be a structure with four layers, including a chromium layer, a chromium-copper alloy layer, a copper layer and a silver layer. Alternatively, the under-bump metallic layer can be a structure with two layers, including a lower layer such as a titanium-tungsten alloy layer or a titanium layer and an upper layer such as a copper layer, a nickel layer or a gold layer.

Although the bumps are directly formed on the active surface of a silicon wafer in the aforementioned embodiments, the bumps may also form elsewhere. For example, the bumps may form over a redistribution layer after the redistribution layer is formed on a silicon wafer.

In conclusion, major advantages of this invention includes:

1. A two-stage etching process is used to etch the under-bump metallic layer. During the first etching operation, that is, the etching of the wettable layer and the barrier layer, etchant will not etch the solder bumps because the solder bumps are yet to be formed over the wettable layer. Etchant will contact the solder bumps only when the adhesion layer is etched in the second etching operation. Consequently, the period of contact of solder bumps with etchant is reduced and hence dimensional reduction of the solder bumps is minimized.

2. Peeling of the solder bumps due to contact with etchant during fabrication is also prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming bumps over a silicon wafer having an active surface thereon, the method comprising the steps of:
   forming a first under-bump metallic layer over the active surface of the wafer;
   forming a second under-bump metallic layer over the first under-bump metallic layer;
   conducting a first photolithographic process to form a plurality of photoresist blocks over the second under-bump metallic layer;
   conducting a first etching operation to remove the second under-bump metallic layer outside the photoresist blocks so that only the second under-bump metallic layer underneath the photoresist blocks remains;
   removing the photoresist blocks;
   conducting a second photolithographic process to form a photoresist layer over the second under-bump metallic layer, wherein the photoresist layer has a plurality of openings that exposes the remaining second under-bump metallic layer and the opening is substantially the same or smaller in size than that of the second under-bump metallic layer in order to only expose the remaining second under-bump metallic and not expose the first under-bump metallic layer;
   filling a solder material into each of the openings in the photoresist layer by a plating method to form a solder bumps only disposed on the remaining second under-bump metallic layer and not disposed on the first under-bump metallic layer;
   removing the photoresist layer to expose the first under-bump metallic layer;
   conducting a second etching operation to remove the exposed first under-bump metallic layer so that only the first under-bump metallic layer underneath the remaining second under-bump metallic layer remains; and
   performing a reflow operation to form the solder bumps into ball-like shape bumps after the second etching operation.

2. The method of claim 1, wherein the step of forming the second under-bump metallic layer over the first under-bump metallic layer includes the sub-steps of:
   forming a barrier layer over the first under-bump metallic layer, wherein material constituting the barrier layer includes nickel-vanadium alloy; and
   forming a wettable layer over the barrier layer, wherein material constituting the wettable layer is selected from a group consisting of copper, palladium and gold.

3. The method of claim 2, wherein the first etching operation is carried out using an etchant containing sulfuric acid.

4. The method of claim 2, wherein the barrier layer is etched using diluted phosphoric acid in the first etching operation.

5. The method of claim 2, wherein the wettable layer is etched in the first etching operation using an etchant containing ammonium hydroxide and hydrogen peroxide if the wettable layer is a copper layer.

6. The method of claim 2, wherein the wettable layer is etched in the first etching operation using an etchant containing potassium sulfate ($K_2SO_4$) and glycerol if the wettable layer is a copper layer.

7. The method of claim 1, wherein the first under-bump metallic layer includes an adhesion layer fabricated using a material selected from a group consisting of titanium, titanium-tungsten alloy, aluminum and chromium.

8. The method of claim 7, wherein etchant for etching the adhesion layer in the second etching operation contains hydrogen peroxide ($H_2O_2$), ethylene diamine tetraacetic (EDTA) and potassium sulfate ($K_2SO_4$) when the adhesion layer is a titanium-tungsten alloy layer.

9. The method of claim 7, wherein etchant for etching the adhesion layer in the second etching operation contains hydrogen chloride (HCl) when the adhesion layer is a chromium layer.

10. The method of claim 7, wherein etchant for etching the adhesion layer in the second etching operation contains ammonium hydroxide ($NH_4OH$) and hydrogen peroxide ($H_2O_2$) when the adhesion layer is a titanium layer.

11. The method of claim 7, wherein etchant for etching the adhesion layer in the second etching operation contains hydrogen fluoride (HF) when the adhesion layer is a titanium layer.

12. The method of claim 7, wherein etchant for etching the adhesion layer in the second etching operation contains phosphoric acid and acetic acid when the adhesion layer is an aluminum layer.

13. A method of forming bumps over a silicon wafer having an active surface thereon, the method comprising the seeps of:
   forming a first under-bump metallic layer over the active surface of the wafer;
   forming a second under-bump metallic layer over the first under-bump metallic layer;
   removing a portion of the second under-bump metallic layer to expose the first under-bump metallic layer;
   implanting at least one solder bump only on the remaining second under-bump metallic layer and not on the first under-bump metallic layer by a plating method using a patterned photoresist layer having an opening that is substantially the same or smaller in size than that of the second under-bump metallic layer;
   removing the exposed first under-bump metallic layer so that only the first under-bump metallic layer underneath the remaining second under-bump metallic layer remains; and
   performing a reflow operation to form the solder bumps into ball-like shape bumps after the exposed first under-bump metallic layer is removed.

14. The method of claim 13, wherein the step of forming the second under-bump metallic layer over the first under-bump metallic layer includes the sub-steps of:
   forming a barrier layer over the first under-bump metallic layer, wherein material constituting the barrier layer includes nickel-vanadium alloy; and
   forming a wettable layer over the barrier layer, wherein material constituting the wettable layer is selected from a group consisting of copper, palladium and gold.

15. The method of claim 14, wherein the second under-bump metallic layer is removed by etching and the barrier layer is etched using an etchant containing sulfuric acid.

16. The method of claim 14, wherein the second under-bump metallic layer is removed by etching and the barrier layer is etched using diluted phosphoric acid.

17. The method of claim 14, wherein the second under-bump metallic layer is removed by etching and the wettable layer is etched in the first etching operation using an etchant containing ammonium hydroxide and hydrogen peroxide if the wettable layer is a copper layer.

18. The method of claim 14, wherein the second under-bump metallic layer is removed by etching and the wettable layer is etched in the first etching operation using an etchant containing potassium sulfate ($K_2SO_4$) and glycerol if the wettable layer is a copper layer.

19. The method of claim 13, wherein the first under-bump metallic layer includes an adhesion layer fabricated using a material selected from a group consisting of titanium, titanium-tungsten alloy, aluminum and chromium.

20. The method of claim 19, wherein the exposed first under-bump metallic layer is removed by etching and the etchant for etching the adhesion layer in the second etching operation contains hydrogen peroxide ($H_2O_2$), ethylene diamine tetraacetic (EDTA) and potassium sulfate ($K_2SO_4$) when the adhesion layer is a titanium-tungsten alloy layer.

21. The method of claim 19, wherein the exposed first under-bump metallic layer is removed by etching and the etchant for etching the adhesion layer in the second etching operation contains hydrogen chloride (HCl) when the adhesion layer is a chromium layer.

22. The method of claim 19, wherein the exposed first under-bump metallic layer is removed by etching and the etchant for etching the adhesion layer in the second etching operation contains ammonium hydroxide ($NH_4OH$) and hydrogen peroxide ($H_2O_2$) when the adhesion layer is a titanium layer.

23. The method of claim 19, wherein the exposed first under-bump metallic layer is removed by etching and the etchant for etching the adhesion layer in the second etching operation contains hydrogen fluoride (HF) when the adhesion layer is a titanium layer.

24. The method of claim 19, wherein the exposed first under-bump metallic layer is removed by etching and the etchant for etching the adhesion layer in the second etching operation contains phosphoric acid and acetic acid when the adhesion layer is an aluminum layer.

\* \* \* \* \*